United States Patent
Zhang

(10) Patent No.: US 7,646,204 B2
(45) Date of Patent: Jan. 12, 2010

(54) METHOD AND SYSTEM FOR TESTING A SETTLING TIME FOR A DEVICE-UNDER-TEST

(75) Inventor: Lianrui Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 555 days.

(21) Appl. No.: 11/359,901

(22) Filed: Feb. 22, 2006

(65) Prior Publication Data

US 2006/0284661 A1 Dec. 21, 2006

Related U.S. Application Data

(60) Provisional application No. 60/692,867, filed on Jun. 21, 2005.

(51) Int. Cl.
*G01R 27/28* (2006.01)
(52) U.S. Cl. .................. 324/618; 708/404; 702/89
(58) Field of Classification Search .............. 324/618; 327/50
See application file for complete search history.

(56) References Cited

U.S. PATENT DOCUMENTS

| | | | |
|---|---|---|---|
| 4,118,665 A * | 10/1978 | Reinhardt | 324/617 |
| 4,773,034 A * | 9/1988 | Debus, Jr. | 708/323 |
| 4,833,403 A | 5/1989 | Tamamura et al. | |
| 5,162,744 A | 11/1992 | Koozer | |
| 6,067,061 A * | 5/2000 | Friedman | 345/74.1 |
| 6,396,889 B1 | 5/2002 | Sunter et al. | |
| 6,448,948 B1 * | 9/2002 | Friedman | 345/74.1 |
| 6,888,765 B1 * | 5/2005 | Kotowski et al. | 365/201 |
| 2003/0163267 A1 * | 8/2003 | Premy | 702/72 |

OTHER PUBLICATIONS

Application note 1MA15_0E, "Measuring Frequency Settling Time for Synthesizers and Transmitters", Rohde & Schwartz GmbH & Co KG, published Feb. 1, 1999 (Furnished in a previous Office Action).*

* cited by examiner

*Primary Examiner*—Timothy J Dole
*Assistant Examiner*—Benjamin M Baldridge
(74) *Attorney, Agent, or Firm*—Yingsheng Tung; Wade J. Brady, III; Frederick J. Telecky, Jr.

(57) ABSTRACT

A system and method are disclosed for testing a settling time of a device-under-test (DUT). A method for determining a settling time of a device-under-test (DUT) includes activating a DUT to generate an output signal and mixing the output signal of the DUT and a reference signal to generate a mixed signal. An amplitude threshold is set for the mixed signal relative to an amplitude of the mixed signal and the settling time of the DUT is determined based on a last time that the amplitude of the mixed signal crosses the amplitude threshold relative to the activation of the DUT.

16 Claims, 4 Drawing Sheets

METHOD AND SYSTEM FOR TESTING A SETTLING TIME FOR A DEVICE-UNDER-TEST

CROSS REFERENCE TO RELATED APPLICATION

This application claims the benefit of U.S. provisional patent application Ser. No. 60/692,867, which was filed Jun. 21, 2005, and entitled METHOD TO ACCURATELY MEASURE PHASE LOCKED LOOP (PLL) LOCK TIME AND TRANSCEIVER FREQUENCY SETTLING TIME FOR HIGH THROUGHPUT PRODUCTION, which is incorporated herein by reference.

TECHNICAL FIELD

This invention relates to electronic circuits, and more specifically to a method and system for testing a settling time for a device-under-test (DUT).

BACKGROUND

As the market for communications devices increases, so also does the market for associated electronic components. Examples of such components include phase-locked loops (PLL) and transceivers. Such components generate frequency signals necessary for the operation of the communications devices, and may often be required to switch between frequencies. However, as the market for such components increases, so also does the demand for higher performance of these components. As an example, a given PLL or transceiver often does not settle on a switched frequency immediately. As a result, the given PLL or transceiver may have a performance demand in the form of a reduced settling or lock time in generating the frequency signals or switching from one frequency to another.

Due to the increasing demand for higher performance of the associated electronic components of communications devices, such as PLLs and transceivers, manufacturers of such components may want to not only ensure that a given PLL or transceiver meets or exceeds the settling or lock time specification, but that the testing of such specification is performed efficiently. Typically, when testing a settling or lock time, a given device-under-test (DUT) is activated to generate an output signal, and the output signal is down-converted to an intermediate frequency. The intermediate frequency can then be captured by a digitizer, and a settled frequency error can be calculated by averaging zero-crossings over a burst of signals within a specified frequency. The settling or lock time can then be determined from the frequency error.

The method of averaging zero-crossings over a burst of signals, however, can lead to sampling errors through uncertainties of time quantization. Additionally, by averaging a number of periods of signal bursts, the zero-crossing method of determining the settling or lock time of a DUT can be inaccurate. Such uncertainties and inaccuracies can lead to acceptance of bad components and/or rejection of good components. To increase the accuracy of zero-crossing testing of a component, the intermediate frequency can be decreased. However, this may result in a longer testing time necessary for data capture.

SUMMARY

One embodiment of the present invention includes a method for determining a settling time of a device-under-test (DUT). The method includes activating a DUT to generate an output signal and mixing the output signal of the DUT and a reference signal to generate a mixed signal. An amplitude threshold for the mixed signal is set relative to an amplitude of the mixed signal. The settling time of the DUT is determined based on a last time that the amplitude of the mixed signal crosses the amplitude threshold relative to the activation of the DUT.

Another embodiment of the present invention includes a method for ascertaining a settling time of DUT. The method includes activating a DUT to generate an output signal having an expected substantially fixed frequency. The output signal is mixed with a reference signal to generate a mixed signal, the reference signal having a frequency that is substantially equal to the expected frequency of the output signal. The settling time of the DUT is determined based on an amplitude of the mixed signal prior to settling to a substantially DC signal.

Another aspect of the present invention provides a system for testing a settling time of at least one DUT. The system includes a signal generator configured to generate a reference signal, the reference signal having a first frequency, the first frequency being substantially equal to an expected frequency of an output signal of the at least one DUT. A frequency mixer is configured to combine the output signal of the at least one DUT and the reference signal to provide a mixed signal having a frequency that is substantially equal to zero after the output signal of the at least one DUT settles. A data evaluation system determines the settling time of the DUT based on the mixed signal relative to an amplitude threshold.

DETAILED DESCRIPTION

The present invention relates to electronic circuits, and more specifically to a system and method for determining a settling time for a device-under-test (DUT). A DUT generates an output signal based on a received input signal. The output signal of the DUT can be mixed by a frequency mixer with a reference signal. The reference signal can have a frequency that is substantially equal to an expected frequency of the output signal. Accordingly, after activation of the DUT to generate the output signal, the mixed signal that is output by the frequency mixer can settle to a frequency that is substantially equal to zero, and thus can be a substantially DC signal. The mixed signal can be captured by a digitizer. A settling time for the DUT can be determined based on the last time the mixed signal crosses an amplitude threshold relative to the time of activation of the DUT. If, after a predetermined time period, a settling time for the DUT cannot be determined, a fast-Fourier transform (FFT) operation can be performed on the mixed signal to determine a frequency error. The frequency error can be applied to the reference signal to set the mixed signal frequency to substantially equal to zero to determine the settling time of the DUT.

Figure 1:
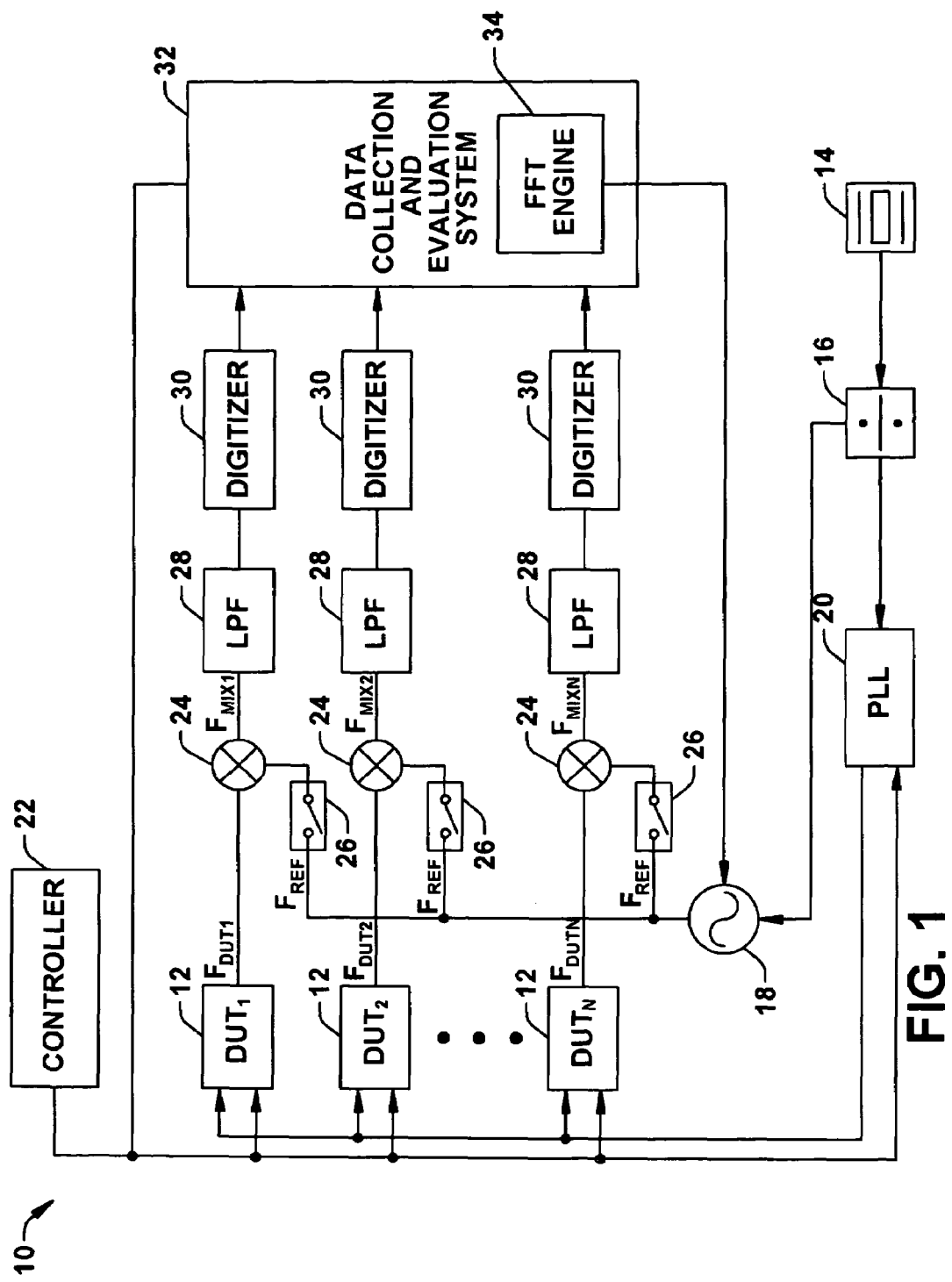
FIG. 1 illustrates an example of a test system for testing a settling time of a plurality of devices-under-test (DUTs) in accordance with an aspect of the invention.

FIG. 1 illustrates an example of a test system 10 for testing a settling time of one or more devices-under-test (DUTs) 12, numbered $DUT_1$ through $DUT_N$, where N is a positive integer greater than or equal to 1, in accordance with an aspect of the invention. The DUTs 12 in the example of FIG. 1 can be phase-locked-loops (PLLs) for which a lock time is being determined, transceivers for which a settling time is being determined, other types of DUTs for which a settling time can be determined, or a mixture of such devices. It is to be understood that, for sake of consistency, as used herein the term "settling time" corresponds to a time to achieve a substantially static signal condition relative to an activation time, regardless of the type of DUT for which the test system operates. The test system 10 includes a reference oscillator (e.g., a crystal oscillator) 14 that generates a source signal having a known frequency. The source signal output from the reference oscillator 14 is input to a signal divider 16. The signal divider 16 outputs the source signal to both a continuous wave signal generator 18 and a PLL 20. The continuous wave signal generator 18 generates a reference signal $F_{REF}$. The PLL 20 outputs an input signal having a predetermined frequency to each of the plurality of DUTs 12. The PLL 20 can be tuned to a specific frequency suitable for the DUTs 12 to generate respective output signals $F_{DUT1}$ through $F_{DUTN}$, where N is a positive integer greater than or equal to 1 denoting the number of DUTs in the system 10. Each of the respective output signals $F_{DUT}$ has have an expected frequency according to a specification, as defined, for example, by a customer or manufacturer. For ease of explanation, each of the DUTs 12 and associated signals (e.g., $F_{DUT}$, $F_{MIX}$) will be described generally without reference to which of the 1, 2, ... or N DUTs such signal(s) may relate.

The test system 10 also includes a controller 22. The controller 22 activates each of the DUTs 12 to generate the respective output signals $F_{DUT}$ at a predetermined frequency, which may vary based on the signal from the PLL 20. However, upon activation, the respective output signals $F_{DUT}$ do not instantaneously exhibit the given frequency, but instead settle to the given frequency over a period of time (e.g., the settling time). During this settling time period, the respective output signal $F_{DUT}$ exhibits an initial frequency that can be chaotic and random. Accordingly, the settling time of each of the DUTs 12 is with respect to the time from the activation of the respective DUT 12 by the controller 22 to when this chaotic and/or random frequency characteristic subsides. As an example of activation, the controller 22 could switch a channel of a transceiver DUT 12, such that it begins generating a signal at a different frequency. As another example, the controller 22 could switch a DUT 12 from one frequency to another, such that the PLL DUT 12 begins to lock-on to the new frequency. Essentially, the controller 22 activates each of the DUTs 12 to generate a respective output signal $F_{DUT}$ that settles to a given expected frequency. It is to be understood that the controller 22 could be any type of device that triggers the activation of the DUTs 12, such that any or all of the DUTs 12 generate a respective settling output signal $F_{DUT}$. For example, the controller 22 could be part of a computer automated system that programmatically triggers the activation of the DUTs 12, or alternatively could be a switch or other circuitry that may require human input. While the controller 22 is shown as being separate from a data collection and evaluation system 32, it could be implemented as part of the system 32, as described more fully herein.

Each of the respective output signals $F_{DUT}$ of each of the DUTs 12 is input to a frequency mixer 24. Each of the frequency mixers 24 also receives as an input the reference signal $F_{REF}$ output from the continuous wave signal generator 18. For example, the reference signal $F_{REF}$ can be coupled to the respective frequency mixers 24 via a switch 26. The switches 26 can be controlled by the controller 22 or by the system 34. The continuous wave signal generator 18 can be adjusted to generate the reference signal $F_{REF}$ with a frequency that is substantially equal to the expected frequency of the output signals $F_{DUT}$ from each of the DUTs 12.

As an example, each of DUTs 12 could be Global System for Mobile Communications (GSM) transceivers with a respective output signal $F_{DUT}$ that is expected to be substantially equal to 850 MHz. Accordingly, the reference signal $F_{REF}$ generated by the signal generator 18 can be programmed to also be substantially equal to 850 MHz. It is to be understood that, because each of the DUTs 12 can be separate devices, each with a separate expected frequency, the test system 10 could include a separate signal generator 18 for each of the DUTs 12, such that each of the separate signal generators 18 can be individually programmed and/or configured to match its reference FIG with the expected specification frequencies of the output signals $F_{DUT}$ from each of the respective individual DUTs 12.

Each of the frequency mixers 24 generates respective mixed signals $F_{MIX1}$ through $F_{MIXN}$, where N is a positive integer greater than or equal to one (N≧1) denoting with which DUT the mixed signals is associated. Upon activating a given DUT 12, the respective resultant mixed signal $F_{MIX}$ can have a frequency that is substantially equal to zero after the respective output signal $F_{DUT}$ settles. The resultant mixed signal $F_{MIX}$ can have a frequency that is substantially equal to zero because the frequency of the reference signal $F_{REF}$ can be set substantially equal to the expected frequency of the respective output signal $F_{DUT}$ of the respective DUT 12. For example, a given mixer can be configured to output a respective mixed signal $F_{MIX}$ having a frequency that is a difference (i.e., subtraction) of the frequency of the respective output signal $F_{DUT}$ relative to the frequency of the reference signal $F_{REF}$. Accordingly, because the respective output signal $F_{DUT}$ and the reference signal $F_{REF}$ may have frequencies that are substantially equal, the respective resultant mixed signal $F_{MIX}$ should have a frequency that is substantially equal to zero (e.g., a substantially DC signal). Each of the mixed signals $F_{MIX}$ output from the frequency mixers 24 is input to a respective low-pass filter 28 to filter out high frequency noise components. Each of the respective filtered mixed signals $F_{MIX}$a is input to a digitizer 30. The digitizer 30 converts the respective filtered mixed signals $F_{MIX}$a from an analog form to a corresponding digital form.

Figure 2:
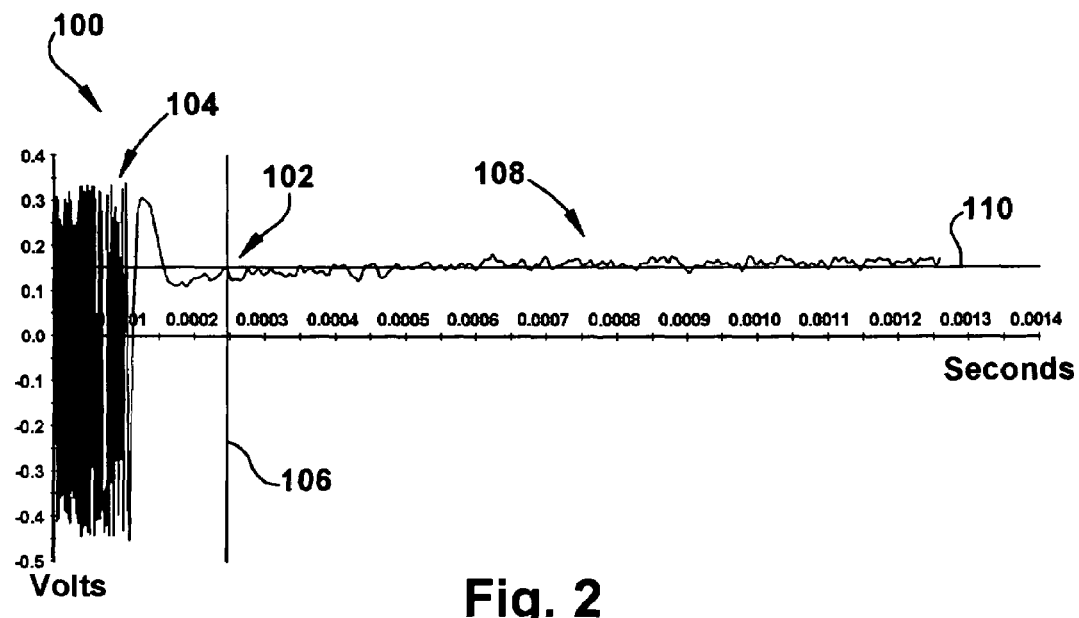
FIG. 2 illustrates an example of a time domain graph of a mixed signal waveform in accordance with an aspect of the invention.

FIG. 2 demonstrates an example of a time domain graph 100 of a mixed signal waveform 102, which could be a filtered and digitized version of a respective mixed signal $F_{MIX}$ of a given DUT 12 in the example of FIG. 1, in accordance with an aspect of the invention. It is to be understood that the discussion herein regarding the example of FIG. 2 is to be made with reference back to FIG. 1. The graph 100 illustrates time in seconds on the X-axis and voltage on the Y-axis. At an activation time (e.g., t=0-seconds), a given DUT 12 is activated by the controller 22 such that it outputs a respective output signal $F_{DUT}$. The respective output signal $F_{DUT}$ is mixed with the reference signal $F_{REF}$ generated by the signal generator 18. The reference signal $F_{REF}$ has a frequency that is substantially equal to the expected frequency of the respective output signal $F_{DUT}$. In the example of FIG. 2, the waveform 102 is illustrated as becoming a substantially DC signal of approximately 0.15 volts after the respective output signal $F_{DUT}$ settles to its output frequency. Prior to settling, the waveform exhibits a generally chaotic or random behavior, such as indicated at 104.

The example of FIG. 2 also demonstrates a specification settling time 106 of the respective DUT 12, such as may be specified by a customer or manufacturer. The specification settling time 106, which is illustrated in the example of FIG. 2 as being approximately 250 microseconds (µS), can define a predetermined threshold for which a determination can be made as to whether or not the given DUT 12 is an acceptable component for an intended application. For example, a manufacturer of the DUT 12 may be required to manufacturer the given DUT 12 with a settling time that is no greater than the specification settling time 106. If the given DUT 12 does not have a settling time that is less than or equal to the specification settling time 106, it may be deemed unacceptable for its intended purpose, and is thus a rejected part. Accordingly, such a specification settling time 106 may be established according to customer or manufacturing specifications.

The example of FIG. 2 also demonstrates a settled region 108. The settled region 108 is the part of the mixed signal waveform 102 after the output signal $F_{DUT}$ has settled. Thus the settled region 108 corresponds to a substantially DC portion of the waveform 102. The DC portion of the waveform 102 in the settled region 108 can result from the mixing of the respective output signal $F_{DUT}$ with the reference signal $F_{REF}$, since the reference signal $F_{REF}$ has a frequency that is substantially equal to the frequency of the respective output signal $F_{DUT}$. It is to be understood that the waveform 102 in the example of FIG. 2 demonstrates that there may be an inherent amount of noise after the mixing of the respective output signal $F_{DUT}$ with the reference signal $F_{REF}$, even if each have a substantially equal frequency. However, as the amplitude of the waveform 102 in the settled region 108 has little variation (e.g., generally only noise), it can be considered a substantially DC signal having a DC amplitude 110 of approximately 0.15V.

The data collection and evaluation system 32 receives each of the respective filtered and digitized mixed signals $F_{MIX}$ and determines a settling time for each of the corresponding DUTs 12. It is to be understood that, although the data collection and evaluation system 32 is demonstrated in the example of FIG. 1 as a single device, it could be a number of circuit devices and/or processors operative to perform the functions described herein. As another example, the data collection and evaluation system 32 could include a personal computer (PC) and/or a work station configured to determine settling times of respective DUTs 12. Additionally, the data collection and evaluation system 32 can receive an output from the controller 22 corresponding to the activation of the DUTs. The data collection and evaluation system 32 might also include the controller 22, and could thus be operative to perform the functions of the controller 22 (e.g., including activation of the DUTs 12). The data collection and evaluation system 32 may also include a display or other output device (not shown) operative to display the digitized waveform 102, such as in the example of FIG. 2 or 3. The data collection and evaluation system 32 may also be configured or programmed to manipulate data based on the respective digitized mixed signals $F_{MIX}$.

Figure 3:
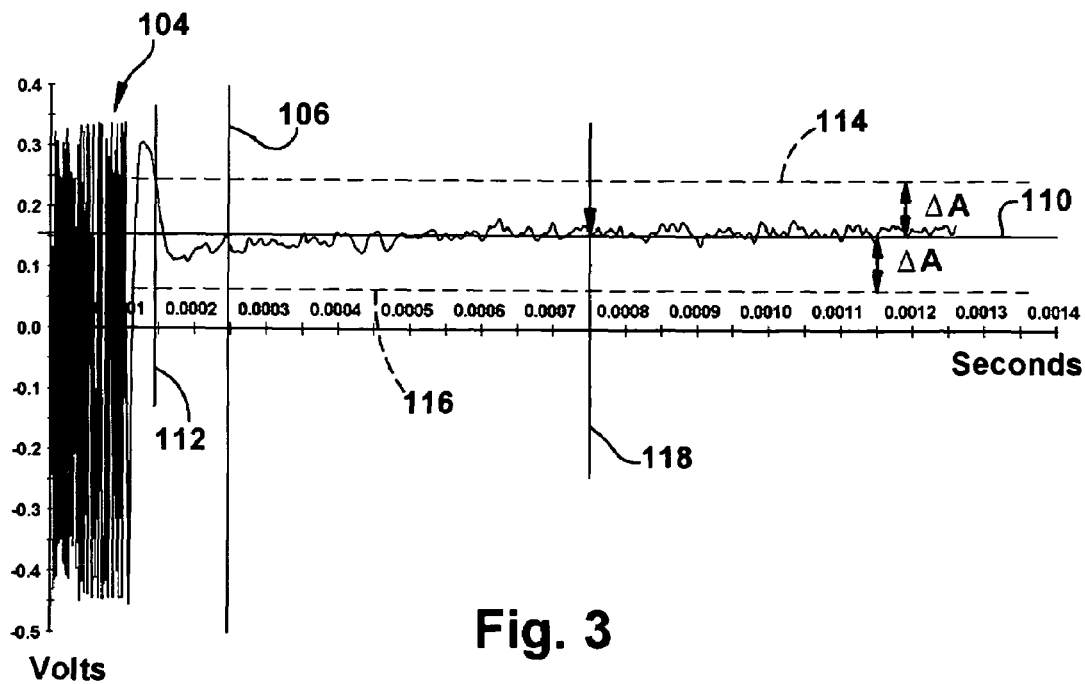
FIG. 3 illustrates an example of a time domain graph of a mixed signal waveform as in FIG. 2 that can be used to determine a settling time of a DUT in accordance with an aspect of the invention.

FIG. 3 illustrates an example of determining a settling time 112 of a DUT using the time domain graph of the mixed signal waveform 102 of FIG. 2 in accordance with an aspect of the invention. It is to be understood that, in the discussion of FIG. 3, like reference numbers as those used with regard to FIG. 2 will be used to describe the digitized waveform 102 in the example of FIG. 3. In addition, the discussion of determining a settling time will be described with reference between the test system 10 of FIG. 1 and of FIG. 3. Those skilled in the art will understand that the determination of a settling time, however, is not limited to the test system 10 in the example of FIG. 1.

The data collection and evaluation system 32 can establish an amplitude threshold relative to an amplitude of the voltage of the DC portion of the mixed signal $F_{MIX}$ that is to be utilized in determining the settling time 112 for a given DUT 12. For example, the amplitude threshold can be implemented as a positive amplitude threshold 114 and a negative amplitude threshold 116 for the digitized waveform 102 relative to the DC amplitude 110 of the digitized waveform. In the example of FIG. 3, the positive amplitude threshold 114 and the negative amplitude threshold 116 are each offset from the DC amplitude 110 of the digitized waveform 102 by an amount $\Delta A$. In the example of FIG. 3, $\Delta A$ is approximately equal to 0.1V, but it is to be understood that different values for $\Delta A$ can be chosen so as to accurately determine the settling time 112 of the respective DUT 12 to mitigate false positive and false negative results. It is also to be understood that the positive amplitude threshold 114 and the negative amplitude threshold 116 need not be symmetric relative to the DC amplitude 110 of the digitized waveform 102. For instance, different values for the positive amplitude threshold 114 and the negative amplitude threshold 116 can be independently chosen.

The data collection and evaluation system 32 also employs an evaluation time 118 for use in determining the settling time 112 of the given DUT 12. The evaluation time 118, can be predetermined. For example, the evaluation time 118 could have a value that is chosen to be approximately three times the specification settling time 106 (e.g., approximately 0.00075 seconds in FIG. 3). However, it is to be understood that any time value for the evaluation time 118 can be chosen according to customer or manufacturer specifications.

To determine the settling time 112 of the given DUT 12, the data collection and evaluation system 32 evaluates the digitized waveform 102, such as between the activation time and up to the evaluation time 118. The data collection and evaluation system 32 back-extrapolates along the digitized waveform 102 until it reaches the last time (i.e., the most recent time) that the amplitude of the digitized waveform 102 crosses the amplitude threshold, such as either one of the positive amplitude threshold 114 or the negative amplitude threshold 116. In the example of FIG. 3, the settling time 112 occurs at approximately 150 µS, which is where the waveform 102 crosses the amplitude threshold. In the example of FIG. 3, the settling time 112 crosses the positive amplitude threshold 114. It is to be understood that the value of $\Delta A$ should thus be chosen to be substantially greater than the inherent noise in the respective resultant DC mixed signal $F_{MIX}$, such that false negative results are avoided. It is also to be understood that the settling time 112 of the given DUT 12 is determined relative to a time of activation of the given DUT 12 (e.g., activation by the controller 22 at 0 seconds). Because the settling time 112 of the given DUT 12 is determined to be less than the specification settling time 106 (e.g., approximately 250 µS), the given DUT 12 meets specification and can be considered an acceptable component.

If the settling time 112 of the given DUT 12 is determined to be greater than the specification settling time 106, the given DUT 12 can be considered a rejected component because it failed to meet specification. However, such a result may have been caused not by a faulty component, but instead by the presence of a frequency error in the digitized waveform 102. That is, the respective output signal $F_{DUT}$ of a given DUT may have a frequency that differs from the expected specification frequency, such as due to manufacturing deviations and tolerances. Accordingly, upon mixing the respective output signal $F_{DUT}$ with the reference signal $F_{REF}$, the respective resultant mixed signal $F_{MIX}$ may not be a substantially DC signal, but instead may be a signal substantially similar to a sine wave having a substantially fixed frequency corresponding to frequency error. An adjustment to the testing of the settling time of the DUT can compensate for such frequency error.

Referring back to the example of FIG. 1, the data collection and evaluation system 32 may include a fast-Fourier transform (FFT) engine 34. The FFT engine 34 may receive a given mixed signal $F_{MIX}$ for which a settling time could not be determined such as due to the presence of a frequency error. Thus, the given mixed signal $F_{MIX}$ may be a signal substantially similar to a sine wave having a substantially fixed frequency. The FFT engine 34 can perform a FFT operation on the mixed signal $F_{MIX}$, such that the signal is transformed from the time domain to the frequency domain. The FFT engine 34 can utilize the frequency domain data to determine the frequency error of the mixed signal $F_{MIX}$, and thus the frequency error of the output signal $F_{DUT}$.

Figure 4:
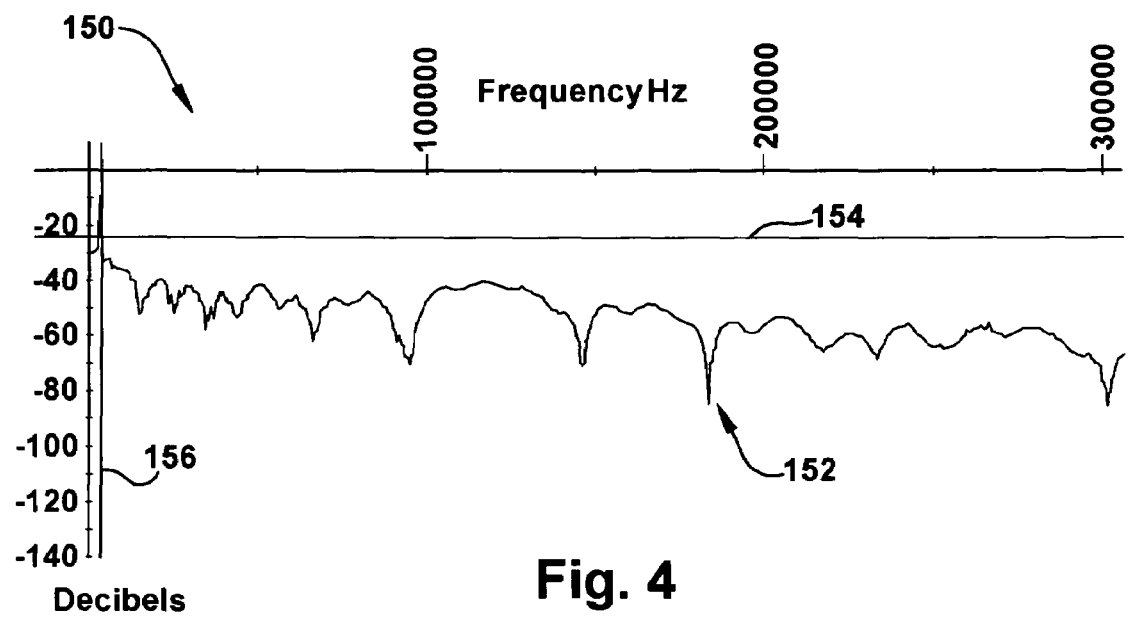
FIG. 4 illustrates an example of a frequency domain graph of a mixed signal waveform in accordance with an aspect of the invention.

FIG. 4 illustrates an example of a frequency domain graph 150 of a frequency domain waveform 152 that can be utilized to determine a frequency error in accordance with an aspect of the invention. It is to be understood that the discussion regarding the example of FIG. 4 is made with reference between the test system 10 of FIG. 1 and the graph 150 of FIG. 4. The graph 150 illustrates frequency in hertz on the X-axis and decibels on the Y-axis. As a given frequency along the X-axis differs from the frequency of the mixed signal $F_{MIX}$, the frequency domain waveform 152 will demonstrate a greater decibel absolute amplitude. However, the frequency along the X-axis that is substantially equal to the frequency error will manifest on the frequency domain waveform 152 as a sharp peak in the direction of 0 decibels. It is to be understood that, although the frequency domain waveform 152 is measured in negative decibels in the example of FIG. 4, it could be inverted and measuring a positive decibel amplitude depending on the reference of the FFT operation.

The FFT engine 34 can set a decibel threshold 154 to determine the frequency error of the mixed signal $F_{MIX}$. In the example of FIG. 4, the decibel threshold 154 is set at approximately −25 decibels. However, the decibel threshold 154 value can be chosen according to customer or manufacturer specifications. The frequency at which the waveform 152 crosses the threshold 154 corresponds to a frequency error in the mixed signal. In the example of FIG. 4, the waveform 152 crosses the threshold 154 at approximately 4 kHz. Accordingly, a frequency error 156 is identified to be approximately 4 kHz.

The data collection and evaluation system 32 can use the determined frequency error 156 of the mixed signal to adjust one or more test parameters utilized in determining the settling time of the DUT 12. Referring back to FIG. 1, the FFT engine 34 or other circuitry in the data collection and evaluation system 32 can cause the continuous wave signal generator 18 to adjust the frequency of the reference signal $F_{REF}$ based on the determined frequency error. That is, the data collection and evaluation system 32 can adjust the continuous wave signal generator 18 to output an adjusted reference signal $F_{REF*}$ that includes the frequency error (e.g., $F_{REF*}=F_{REF}+F_{ERROR}$). Accordingly, the adjusted reference signal $F_{REF*}$ has a frequency that is substantially equal to the frequency of the output signal $F_{DUT}$, which includes the determined frequency error. The mixer 24 combines adjusted reference signal $F_{REF*}$ with the respective output signal $F_{DUT}$ that includes the frequency error. The previous frequency error of the respective output signal $F_{DUT}$ is cancelled-out by the substantially equal amount of frequency error introduced by the adjusted reference signal $F_{REF*}$. The resultant adjusted mixed signal $F_{MIX*}$, therefore, can have a frequency that is substantially equal to zero, and thus provide a substantially DC signal for which a settling time can be determined such as described herein (e.g., with regard to FIG. 3).

The determined frequency error 156 can also be used as an additional criterion for accepting or rejecting the given DUT 12. For example, a given DUT 12 may have a specification output signal frequency tolerance. Upon determining the presence of a frequency error in the respective output signal $F_{DUT}$, the FFT engine 34 can determine the amount of the frequency error, as described above. If the amount of the frequency error is outside of the expected operating parameters (e.g., within an acceptable specification frequency tolerance) then the given DUT 12 can be rejected as a faulty component, or otherwise graded as having lower performance. If the amount of the frequency error is within the acceptable specification frequency tolerance, then the given DUT 12 can be further evaluated to determine the settling time, such as described herein.

Figure 5:
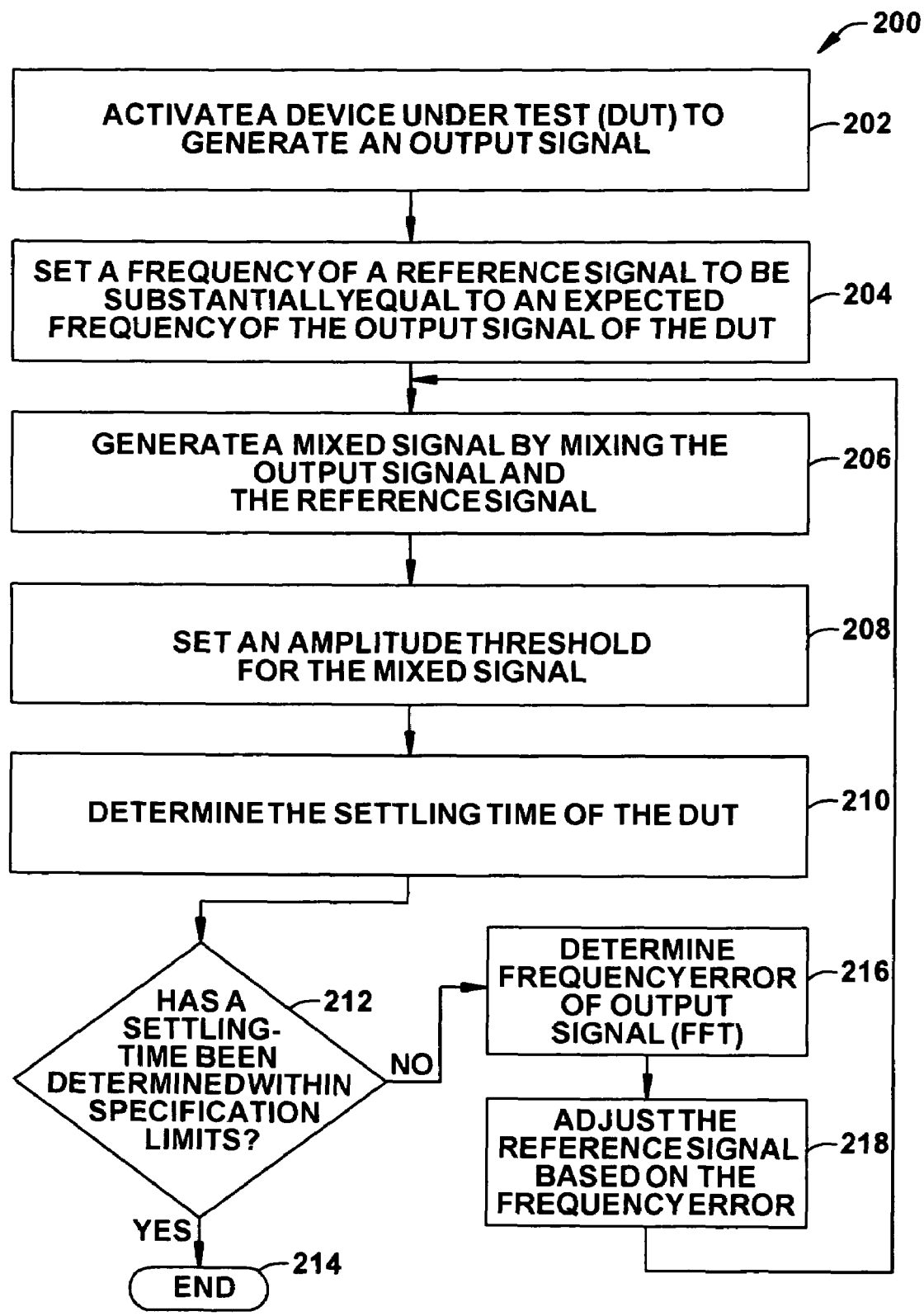
FIG. 5 illustrates a method for testing a settling time of a DUT in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method. It is to be further understood that the following methodology can be implemented in hardware (e.g., a computer, a computer network, or test equipment), software (e.g., as executable instructions running on one or more computer systems or test equipment), or any combination of hardware and software.

FIG. 5 illustrates a method 200 for testing a settling time of a DUT in accordance with an aspect of the invention. At 202, a DUT is activated to generate an output signal. The activation of the DUT can be accomplished through a controller, which could be an automated or a manual process. At 204, a frequency of a reference signal is set to be substantially equal to an expected frequency of the output signal of the DUT. The reference signal can be generated by a continuous wave signal generator. It is to be understood that the method 200 of FIG. 5 can be implemented for a number of DUTs concurrently, and could therefore involve the generation of separate reference signals for each individual DUT.

At 206, a mixed signal is generated by mixing the output signal of the DUT with a reference signal. The mixing of the output signal of the DUT and the reference signal can be accomplished through a frequency mixer. A switch could control the reference signal being input to the frequency mixer. If there is no significant frequency error, the mixed signal should have a frequency substantially equal to zero after the output signal of the DUT settles to its expanded frequency. At 208, an amplitude threshold is set for the mixed signal. For example, positive and negative amplitude thresholds can be chosen according to customer or manufacturer specifications. The thresholds can be set prior to activating the DUT at 202.

At 210, a settling time of the DUT is determined based on a last time that the amplitude of the mixed signal crosses the amplitude threshold. The settling time is determined relative to the activation of the output signal of the DUT. For example, the settling time can be determined by back-extrapolating from an evaluation time along the digitized waveform to make the determination at 210, as described herein.

At 212, a determination is made as to whether the settling time of the DUT is within an evaluation time limit. If the settling time of the DUT has been determined prior to expiration an evaluation time, then the method concludes at 214. If the settling time has not been determined within the evaluation time, then the method proceeds to 216. This may occur if the DUT output signal, and thus the mixed signal, contains an amount of frequency error. At 216, the frequency error is determined. The frequency error could be determined through a FFT operation to ascertain a frequency from the time domain waveform (e.g., a sharp peak of such waveform) according to where the waveform crosses a dB threshold. The sharp peak could be detected, for example, by establishing a decibel threshold through customer or manufacturer specification. At 218, the determined frequency error is applied to the reference signal. From 218, the method returns to 206, such that a settling time can be determined based on the adjusted reference signal, such as described herein.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for determining a settling time of a device-under-test (DUT), the method comprising:
    activating a DUT to generate an output signal;
    mixing the output signal of the DUT and a reference signal to generate a mixed signal;
    setting an amplitude threshold for the mixed signal relative to an amplitude of the mixed signal;
    determining the settling time of the DUT based on a last time that the amplitude of the mixed signal crosses the amplitude threshold relative to the activation of the DUT;
    setting an evaluation time limit relative to the activation of the DUT to establish a time period for determining the settling time of the DUT based on the last time that the amplitude of the mixed signal crosses the amplitude threshold within the evaluation time; and
    determining a frequency error of the mixed signal if the settling time is not determined within the evaluation time.

2. The method of claim 1, wherein the amplitude threshold comprises a positive amplitude threshold and a negative amplitude threshold for the mixed signal relative to the amplitude of the mixed signal, and the settling time of the DUT being determined based on a last time that the amplitude of the mixed signal crosses at least one of the positive amplitude threshold and the negative amplitude threshold relative to the activation of the DUT.

3. The method of claim 1, further comprising setting a frequency of the reference signal substantially equal to an expected frequency of the output signal of the DUT.

4. The method of claim 1, wherein the determining a frequency error comprises performing a fast-Fourier transform (FFT) operation on the mixed signal to determine a frequency at which frequency domain data resulting from the FFT operation crosses a decibel threshold.

5. The method of claim 4, further comprising determining if the determined frequency is outside of expected operating parameters for the DUT.

6. The method of claim 1, further comprising adjusting the reference signal based on the frequency error to generate an adjusted reference signal and mixing the output signal and the adjusted reference signal to generate an adjusted mixed signal, and wherein determining the settling time of the DUT comprises determining the settling time of the DUT based on a last time that the amplitude of the adjusted mixed signal crosses the amplitude threshold.

7. The method of claim 1, further comprising activating a plurality of DUTs to generate respective DUT output signals, the respective output signals of each of the plurality of DUTs being mixed with the reference signal to generate respective mixed signals, respective settling times of each of the plurality of DUTs being determined based on a last time that an amplitude of the respective mixed signal crosses an associated amplitude threshold relative to the activation of the respective one of the plurality of DUTs.

8. A method for ascertaining a settling time of a device-under-test (DUT), the method comprising:
    activating a DUT to generate an output signal having an expected substantially fixed frequency;
    mixing the output signal with a reference signal to generate a mixed signal, the reference signal having a frequency that is substantially equal to the expected frequency of the output signal;
    determining the settling time of the DUT based on an amplitude of the mixed signal prior to settling to a substantially DC signal; and
    adjusting the frequency of the reference signal based on the frequency error if the settling time is not determined within a predetermined evaluation time period to enable the determination of the settling time of the DUT.

9. The method of claim 8, wherein the settling time of the DUT is determined based on a last time that the amplitude of the adjusted mixed signal crosses an amplitude threshold.

10. The method of claim 9, wherein the amplitude threshold comprises a positive amplitude threshold and a negative amplitude threshold for the mixed signal relative to an expected DC amplitude of the mixed signal after settling, and the settling time of the DUT being determined based on a last time that the amplitude of the mixed signal crosses at least one of the positive amplitude threshold and the negative amplitude threshold relative to the activation of the DUT.

11. A system for testing a settling time of at least one device-under-test (DUT), the system comprising:
    a signal generator configured to generate a reference signal, the reference signal having a first frequency, the first frequency being substantially equal to an expected frequency of an output signal of the at least one DUT; and
    a frequency mixer configured to combine the output signal of the at least one DUT and the reference signal to provide a mixed signal having a frequency that is substantially equal to zero after the output signal of the at least one DUT settles;
    a fast-Fourier-transform (FFT) engine operative to perform a FFT operation on the mixed signal to determine a frequency error of the at least one DUT in the absence of the mixed signal having a frequency that is substantially equal to zero within a predetermined period of time; and
    a data evaluation system that determines the settling time of the DUT based on the mixed signal relative to an amplitude threshold.

12. The system of claim 11, wherein the data evaluation system determines the settling time of the at least one DUT based on a time that the amplitude of the mixed signal last crosses the amplitude threshold.

13. The system of claim 11, wherein the amplitude threshold of the mixed signal comprises a positive amplitude threshold and a negative amplitude threshold, each relative to a substantially DC amplitude of the mixed signal, the data evaluation system determining the settling time of the at least one DUT based on a time that the amplitude of the mixed signal last crosses one of the positive amplitude threshold and the negative amplitude threshold.

14. The system of claim 11, wherein the data evaluation system is operative to adjust the reference signal based on the frequency error, the frequency mixer providing an adjusted mixed signal by combining the output signal and the adjusted reference signal, the data evaluation system determining the settling time of the at least one DUT based on an adjusted mixed signal.

15. The system of claim 11, wherein the at least one DUT comprises a plurality of DUTs, the system further comprising a plurality of frequency mixers, each of the plurality of frequency mixers being operative to combine an output signal of a respective one of the plurality of DUTs with the reference signal, such that each of the plurality of frequency mixers generates a respective mixed signal.

16. The system of claim 15, wherein the reference signal further comprises a plurality of reference signals, each of the plurality of reference signals having a frequency that is substantially equal to an expected frequency of an output signal of a respective one of the plurality of DUTs.

* * * * *

UNITED STATES PATENT AND TRADEMARK OFFICE
CERTIFICATE OF CORRECTION

PATENT NO. : 7,646,204 B2  Page 1 of 1
APPLICATION NO. : 11/359901
DATED : January 12, 2010
INVENTOR(S) : Lianrui Zhang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 879 days.

Signed and Sealed this

Twenty-eighth Day of December, 2010

David J. Kappos
*Director of the United States Patent and Trademark Office*